United States Patent
Momiyama et al.

(10) Patent No.: US 6,674,651 B2
(45) Date of Patent: Jan. 6, 2004

(54) ELECTRONIC EQUIPMENT AND BOARD INSERTION/REMOVAL APPARATUS THEREFOR

(75) Inventors: Hiroaki Momiyama, Kanagawa (JP); Takao Mokutani, Shizuoka (JP)

(73) Assignee: Sony Computer Entertainment Inc., Tokyo (JP)

( * ) Notice: Subject to any disclaimer, the term of this patent is extended or adjusted under 35 U.S.C. 154(b) by 114 days.

(21) Appl. No.: 10/114,420

(22) Filed: Apr. 2, 2002

(65) Prior Publication Data

US 2002/0154490 A1 Oct. 24, 2002

(30) Foreign Application Priority Data

Apr. 3, 2001 (JP) .......................................... 2001-104599

(51) Int. Cl.⁷ .............................. H05K 7/10; H05K 7/12
(52) U.S. Cl. ...................... 361/796; 361/798; 361/801; 361/726; 361/741; 361/747; 361/756; 361/759; 174/50; 211/41.17
(58) Field of Search ................................ 361/724, 726, 361/741, 747, 752, 754, 755, 756, 759, 796, 797, 798, 801, 802; 174/50; 211/41.17; 257/678

(56) References Cited

U.S. PATENT DOCUMENTS

| | | | |
|---|---|---|---|
| 4,517,625 A | | 5/1985 | Frink et al. |
| 4,914,552 A | * | 4/1990 | Kecmer ...................... 361/415 |
| 5,010,426 A | * | 4/1991 | Krenz ....................... 360/97.01 |
| 5,479,341 A | * | 12/1995 | Pihl et al. ...................... 364/184 |
| 5,668,696 A | * | 9/1997 | Schmitt ....................... 361/685 |
| 5,684,673 A | * | 11/1997 | Shibasaki et al. ........... 364/686 |
| 6,115,237 A | * | 9/2000 | Zahorsky et al. ........... 361/679 |
| 6,498,730 B2 | * | 12/2002 | Centola et al. ............. 361/759 |
| 6,549,424 B1 | * | 4/2003 | Beseth et al. ............... 361/801 |
| 2003/0117779 A1 | * | 6/2003 | Gough et al. ............... 361/728 |

FOREIGN PATENT DOCUMENTS

| | | |
|---|---|---|
| DE | 198 32 058 | 1/2000 |
| JP | 8-148864 | 6/1996 |
| WO | 99/55127 | 10/1999 |

\* cited by examiner

*Primary Examiner*—David Martin
*Assistant Examiner*—Dameon E. Levi
(74) *Attorney, Agent, or Firm*—Katten Muchin Zavis Rosenman

(57) ABSTRACT

An electronic equipment has an enclosure, a backplane board, a connector, a child board, a connection plate on the bottom edge of the child board mating with the connector, a guide, a rack gear, and a pinion gear. The guide moves within a child board housing part inside the enclosure between an upper and a lower position along a substantially vertical direction. At the upper position, the guide slidably mates with the child board and guides the child board to a temporary attachment position substantially vertically, and movement from the upper to the lower position causes the child board at the temporary attachment position to move substantially vertically to a fully attached position. The rack gear fixed relative to the guide, and the rotating shaft has a pinion gear meshing with the rack gear, and is supported so as to rotate freely relative to the enclosure.

10 Claims, 6 Drawing Sheets

ELECTRONIC EQUIPMENT AND BOARD INSERTION/REMOVAL APPARATUS THEREFOR

BACKGROUND OF THE INVENTION

1. Field of the Invention

The present invention relates to a board insertion/removal apparatus for electronic equipment, which has mother board and a child board.

2. Description of the Related Art

With regard to a piece of electronic equipment having a mother board and a child board installed within an enclosure, there are diverse directions and methods of inserting and removing the child board with relative to the enclosure, depending upon how the equipment is to be used.

For example, in a piece of equipment mounted in a 19-inch rack or the like, there is a need to enable maintenance of a child board without being affected by the equipment mounted above and below the equipment of interest. For this reason, the structure adopted is one in which a mother board is disposed in an upright attitude at the front of the rear panel of the enclosure, and an aperture and a door that can be opened and closed are provided at the front panel of the equipment, a child board being inserted in and removed from the mother board via the aperture in an upright attitude so that it intersects with the mother board substantially perpendicularly, or a structure in which the reverse is done, the mother board being disposed at the rear of the front panel, and the child board being inserted into and removed from the mother board via an aperture and door provided at the rear panel of the equipment. In either type of structure, a plurality of child boards are disposed substantially parallel to each other, and when a child board is inserted or removed, the front part of the child board in the insertion direction is mated with or removed from a connector fixed to the surface of the mother board.

In this structure, in order to cool the inside of the enclosure so as not to affect other equipment, it is necessary to dispose a fan at the rear panel or between the rear panel and the mother board, so that cooling air is caused to flow in the front-to-rear direction of the enclosure.

When cooling air is caused to flow in the front-to-rear direction of the enclosure, however, because the air is largely blocked by the mother board, the cooling effect is not necessarily sufficient.

SUMMARY OF THE INVENTION

A form of construction exists which takes into consideration the flow distribution of cooling air, in which the mother board is disposed at the bottom panel of the enclosure, and in which an aperture and cover are provided at the upper panel of the enclosure, a child board being inserted into the mother board via the aperture in an upright attitude relative to the mother board.

Although this structure is effective with regard to air flow relative to the child board, when performing maintenance on a child board it is necessary to pull the entire piece of equipment out to a position outside the rack, at which equipment above and below it in the rack do not present interference, in order to remove the cover on the upper panel of the enclosure to enable maintenance. Additionally, because the entire piece of equipment is pulled out, it is necessary to provide special additional rack mounting rails, thereby increasing the size of the structure. An additional problem arises because of the need to provide safety measures to prevent the rack from falling over, for example, because of the balance in weight between the pulled-out equipment and the rack and other equipment installed therein.

With a conventional structure, it was difficult to achieve both ease of insertion and removal for maintenance and a good distribution of air flow for cooling.

Accordingly, it is an object of the present invention, in consideration of the above-noted drawbacks in the conventional art, to provide a structure that achieves and improves both the ease of insertion and removal of a child board when performing maintenance for example and the flow of cooling air.

In order to achieve the above-noted objects, a piece of electronic equipment to which the present invention is applied has an enclosure, a mother board, a first connection part, a child board, a second connection part, a guide, a rack gear, a rotating shaft, and a pinion gear. The enclosure has a portioned child board housing part, and an aperture which opens the child board housing part at the side of the enclosure. The mother board is disposed so as to be fixed to the bottom panel of the enclosure. The first connection part is fixed to the mother board, and faces the child board housing part. The child board is inserted in a substantially horizontal direction in a substantially vertical upright attitude through the aperture, and inserted at a temporary attachment position. The second connection part is provide at a lower edge of the child board and, by the child board at the temporary attachment position moving along a substantially vertical direction so as to reach a fully attached position, mates with the first connection part, so as to make an electrical connection. The guide is provided so as to enable free movement between an upper position and a lower position within the child board housing part along a substantially vertical direction. At the upper position, the guide slidably mates with an upper edge part of the child board so as to guide the child board toward the temporary attachment position along a substantially horizontal direction, so that by movement from the upper position to the lower position, the child board at the temporary attachment position is caused to move toward the permanent attachment position in a substantially vertical direction, and at the lower position the upper edge part of the child board is held and maintained in the fully attached position. The rack gear is fixed relative to the guide. The rotating shaft has a pinion gear, which meshes with the rack gear, and is supported so as to enable its rotation relative to the enclosure. By the rotating shaft being rotationally operated in a prescribed direction (forward direction), the guide, via the pinion gear and the rack gear, moves from the lower position to the upper position, and by being rotationally operated in the opposite direction, the guide moves from the upper position to the lower position.

In the above-described mechanism, when the child board is attached, the guide is set at the upper position, the upper edge part of the child board, which is substantially upright in a vertical attitude, being caused to mate with the guide as the child board is inserted from the side aperture into the child board housing part. By this action, the child board, in a substantially vertically upright attitude, is inserted along a substantially horizontal direction into the temporary attachment position within the child board housing part in accordance with the guide.

Once the child board reaches the temporary attachment position, the rotating shaft is caused to rotate in the opposite direction. The effect of the rotating shaft rotating in the opposite direction is that the pinion gear rotates in concert with the rotating shaft, the rack gear meshed with the pinion gear moving downward, and the guide moving to the lower position. By this action, the child board at the temporary attachment position moves along a substantially horizontal direction so as to reach the permanent attachment position, the second connection part and the first connection part mating so as to be mutually connected. In this condition, the guide holds the upper edge part of the child board so as to maintain it in the fully attached position.

To remove the child board, the rotating shaft is caused to rotate in the forward direction. When the rotating shaft rotates in the forward direction, the pinion gear rotates in concert with the rotating shaft, and the rack gear meshed with the pinion gear move upward, the guide moving to the upper position. By this action, the first connection part and the second connection part are disconnected, and the child board at the fully attached position moves along a substantially vertical direction so as to reach the temporary attachment position.

When the child board reaches the temporary attachment position, the child board is pulled out along the guide, and caused to be exposed from the aperture, enabling the complete removal of the upper edge part of the child board from the guide if necessary.

In essence, the insertion and removal of the child board with respect to the mother board within the child board housing part is performed by substantially vertical-direction movement, and the insertion and removal of the child board with respect to the child board housing part is performed by substantially horizontal-direction movement.

The result is that, because the child board is inserted and removed from the side of the enclosure, even if the electronic equipment remains installed within a rack or the like, it is possible to easily remove the child board for maintenance, without interference from other equipment disposed above or below the electronic equipment of interest.

Because the mother board is disposed at the bottom part of the enclosure, the child board being housed and held within the child board housing part in a substantially vertical attitude, by causing cooling air to flow along the child board insertion direction, it is possible achieve a good flow of cooling air, without blockage by either the mother board or the child board.

Additionally, because the insertion and removal of the child board can be performed with the electronic equipment remaining installed in the rack, the need for a rack mounting rail to enable the equipment to be pulled out of the rack is eliminated, as is an increase in the size of the structure, and the need to provide a safety measure to prevent the rack from falling over.

The rotating shaft can be disposed at the top part of the guide in an attitude that is substantially parallel with the insertion direction of the child board, and a plurality of sets rack gears and pinion gears can be provided along the rotating shaft.

By doing the above, there is a further improvement in the vertical movement stability of the child board by the effect of the rack gears and pinion gears.

It is alternatively possible to fix the child board relative to the enclosure within the child board housing part, to perform positioning of the child board at the temporary attachment position by contact with the child board inserted forward edge part, and to further provide a positioning guide member which mates with the inserted forward edge part mating with the slide and the child board and guides the child board from the temporary attachment position to the fully attached position.

By doing the above, the position of the child board at the temporary attachment position is easily and reliably established, and there is a further improvement in the stability of the movement of the child board toward the fully attached position.

A rotationally operated lever can further be provided, so as to extend from the rotating shaft, thereby facilitating rotational operation of the rotating shaft.

The ratio between the length of the lever and the gear diameter of the pinion gear can be established in accordance with the contact pressure with which the first connection part and the second connection part mate. By doing this, it is possible to avoid the application of excessive force when the first and second connection parts are mated or disconnected from one another.

DETAILED DESCRIPTION OF THE PREFERRED EMBODIMENTS

An embodiment of the present invention is described below, with references made to accompanying drawings.

Figure 1:
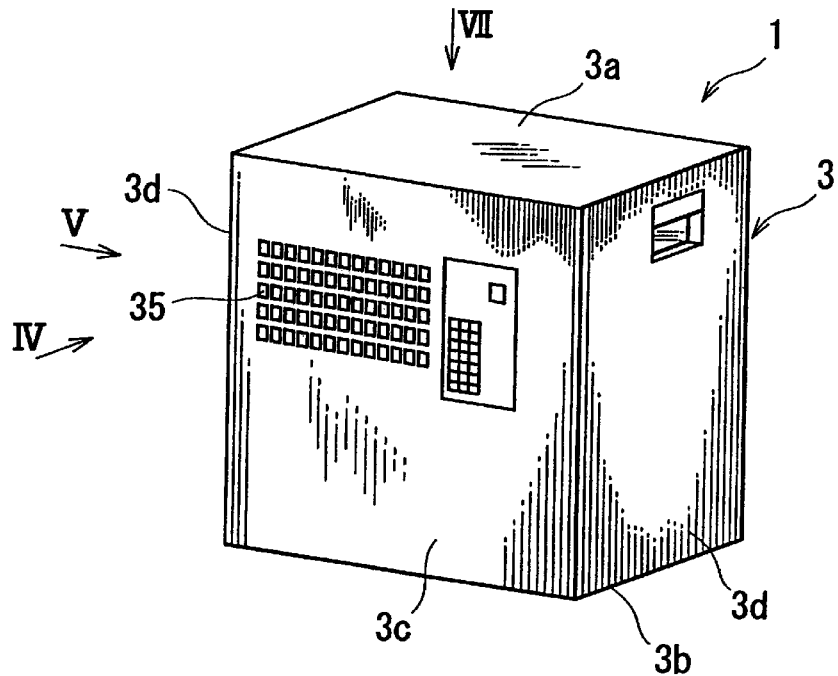
FIG. 1 is an outer oblique view from the frontal direction of a piece electronic equipment according to an embodiment of the present invention.
Figure 2:
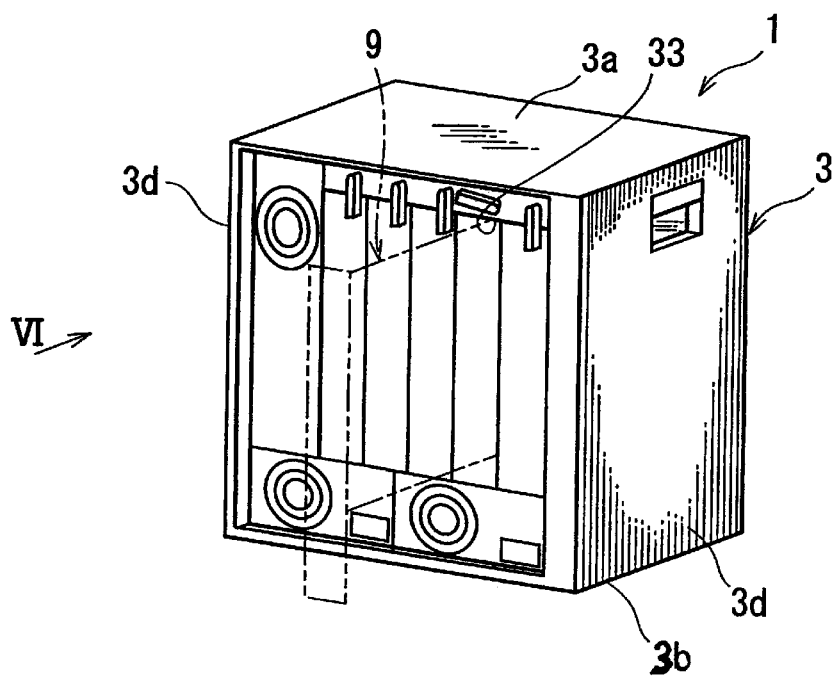
FIG. 2 is an outer oblique view of the electronic equipment of FIG. 1, viewed from the rear direction.
Figure 3:
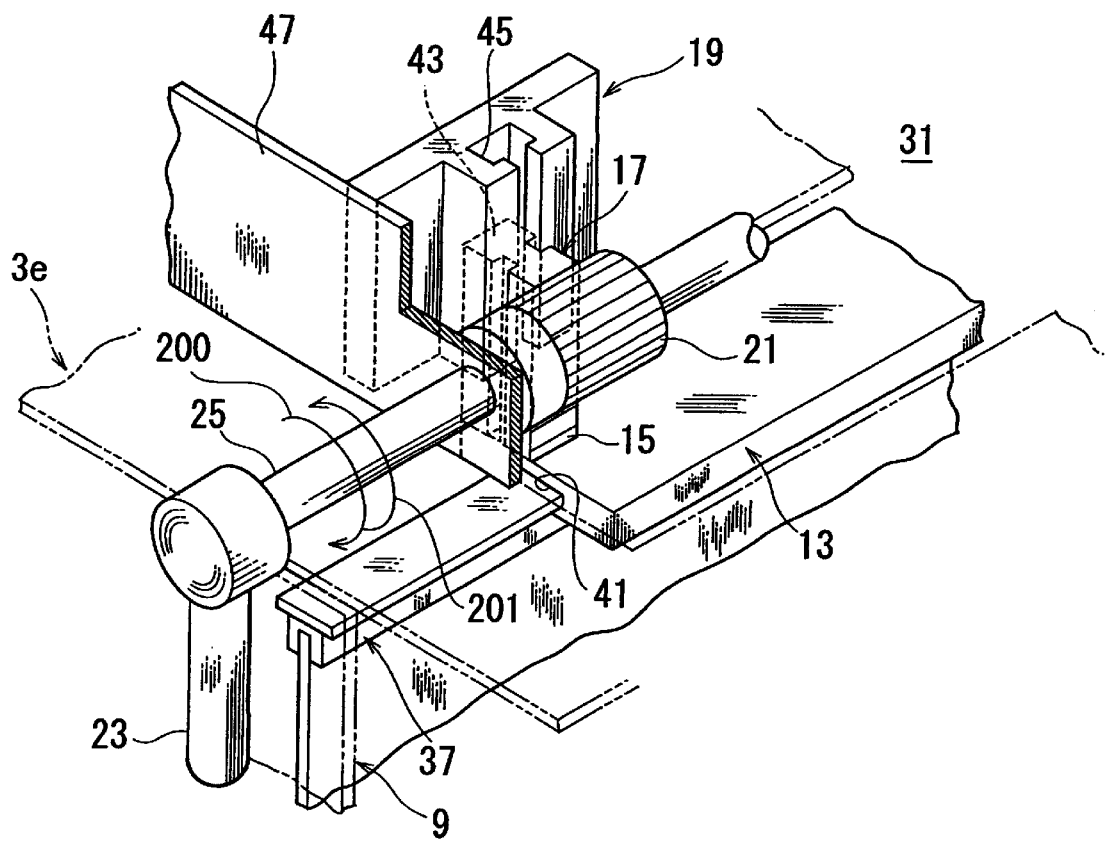
FIG. 3 is an oblique view showing the main parts of an insertion/removal mechanism according to the embodiment of the present invention shown in FIG. 1.
Figure 4:
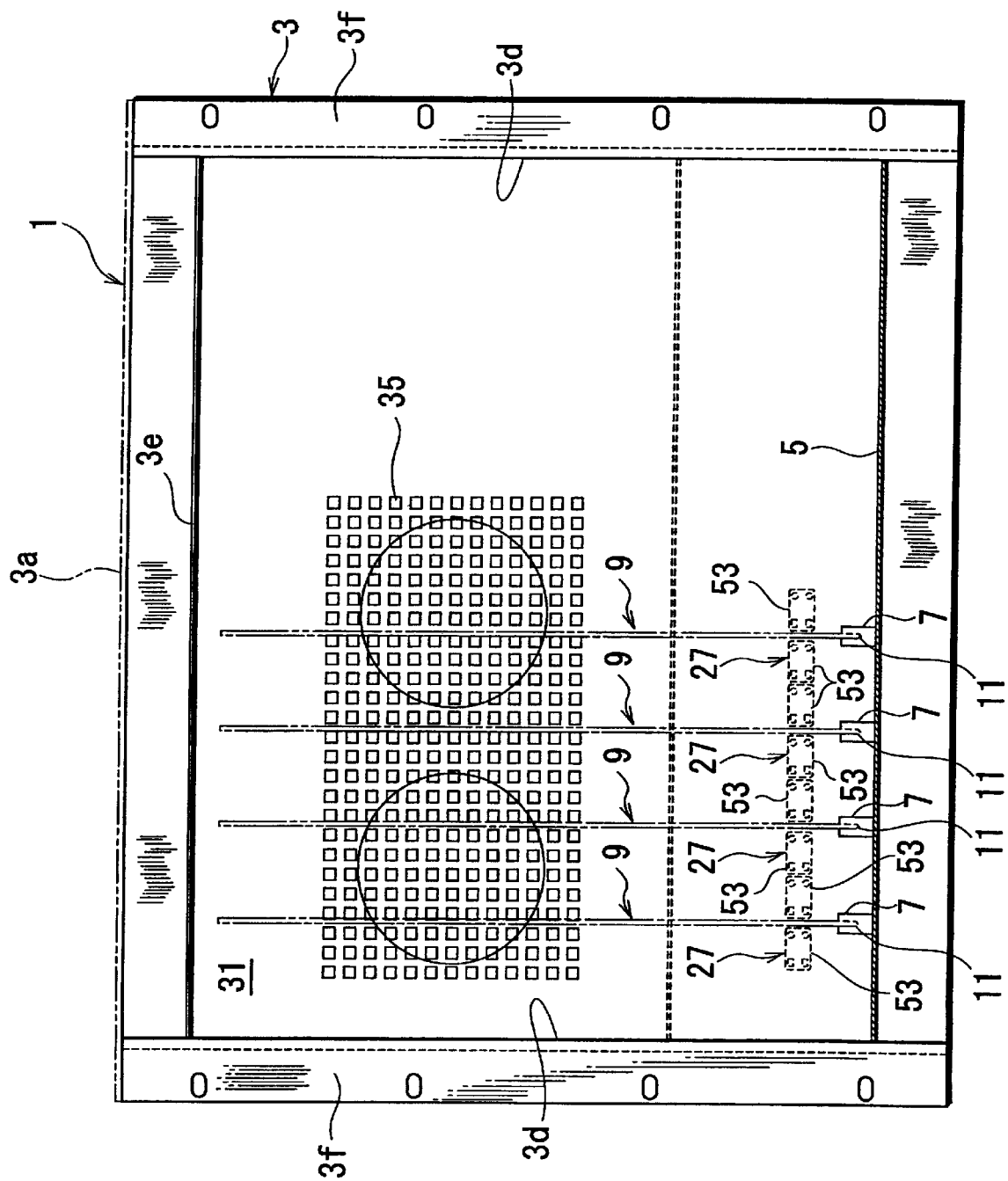
FIG. 4 is a front elevation in the direction IV of FIG. 1, with part of the internal structure of the electronic equipment omitted.
Figure 5:
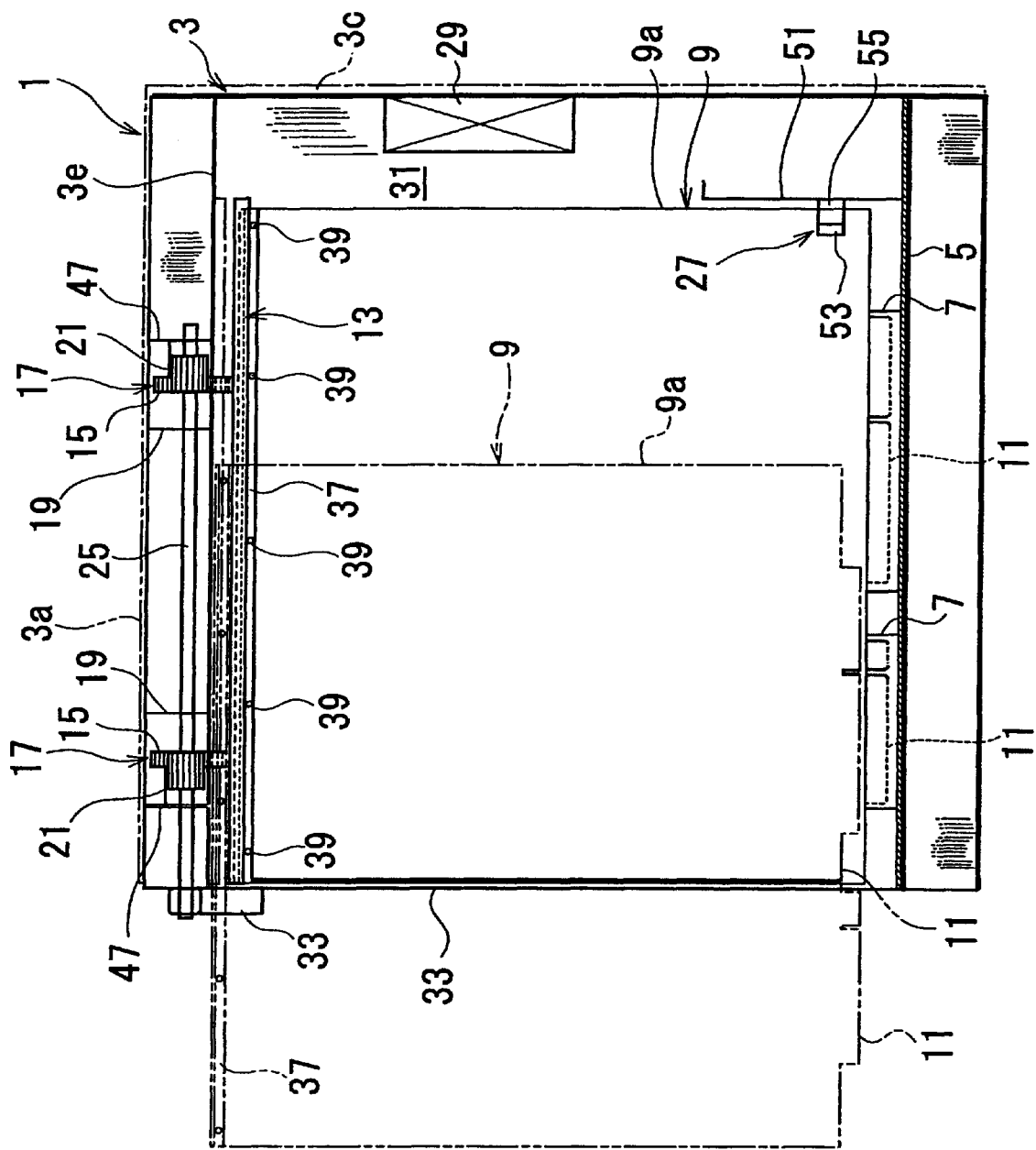
FIG. 5 is a front elevation in the direction V of FIG. 1, with part of the internal structure of the electronic equipment omitted.
Figure 6:
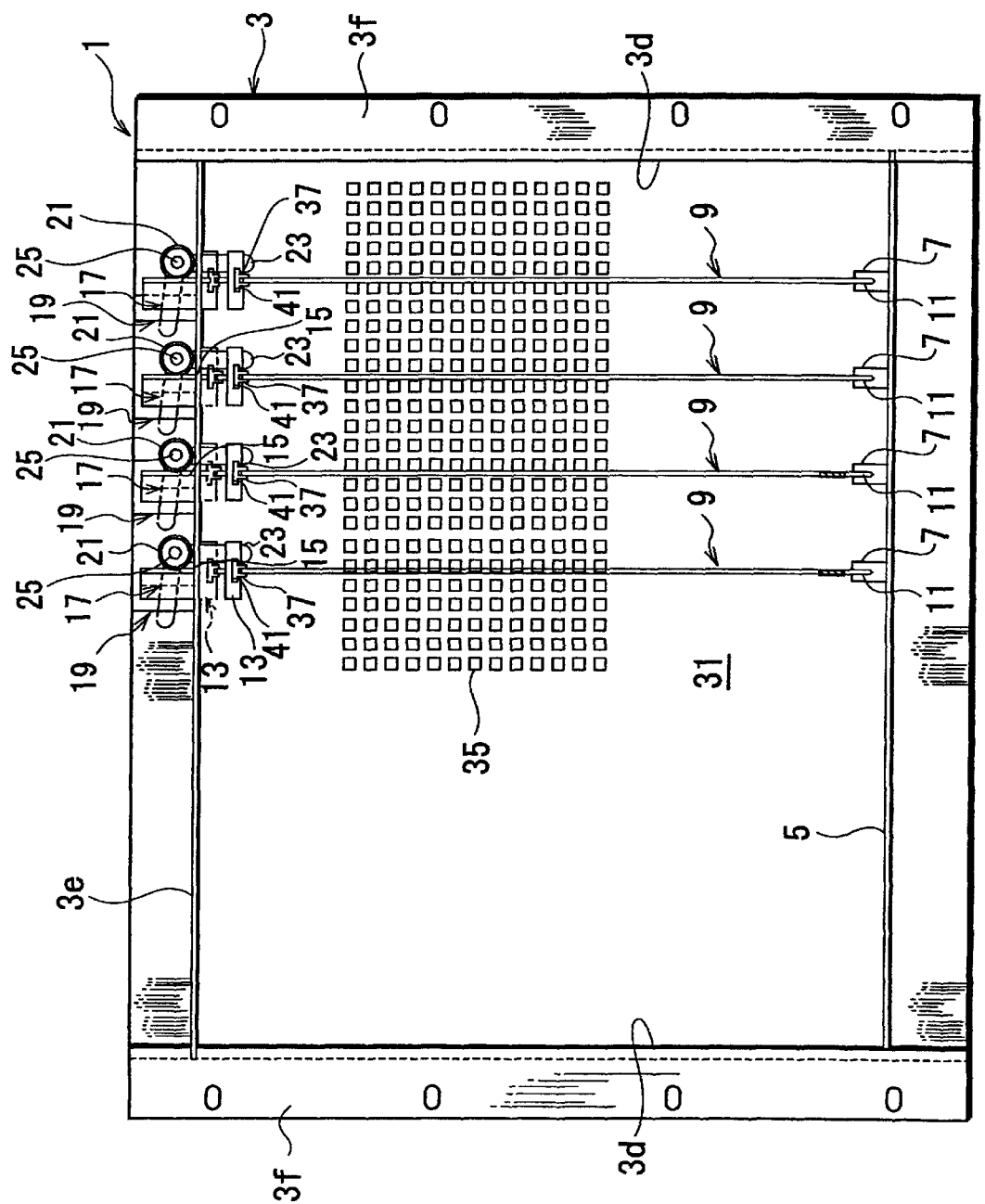
FIG. 6 is a rear elevation in the direction VI of FIG. 2, with part of the internal structure of the electronic equipment omitted.
Figure 7:
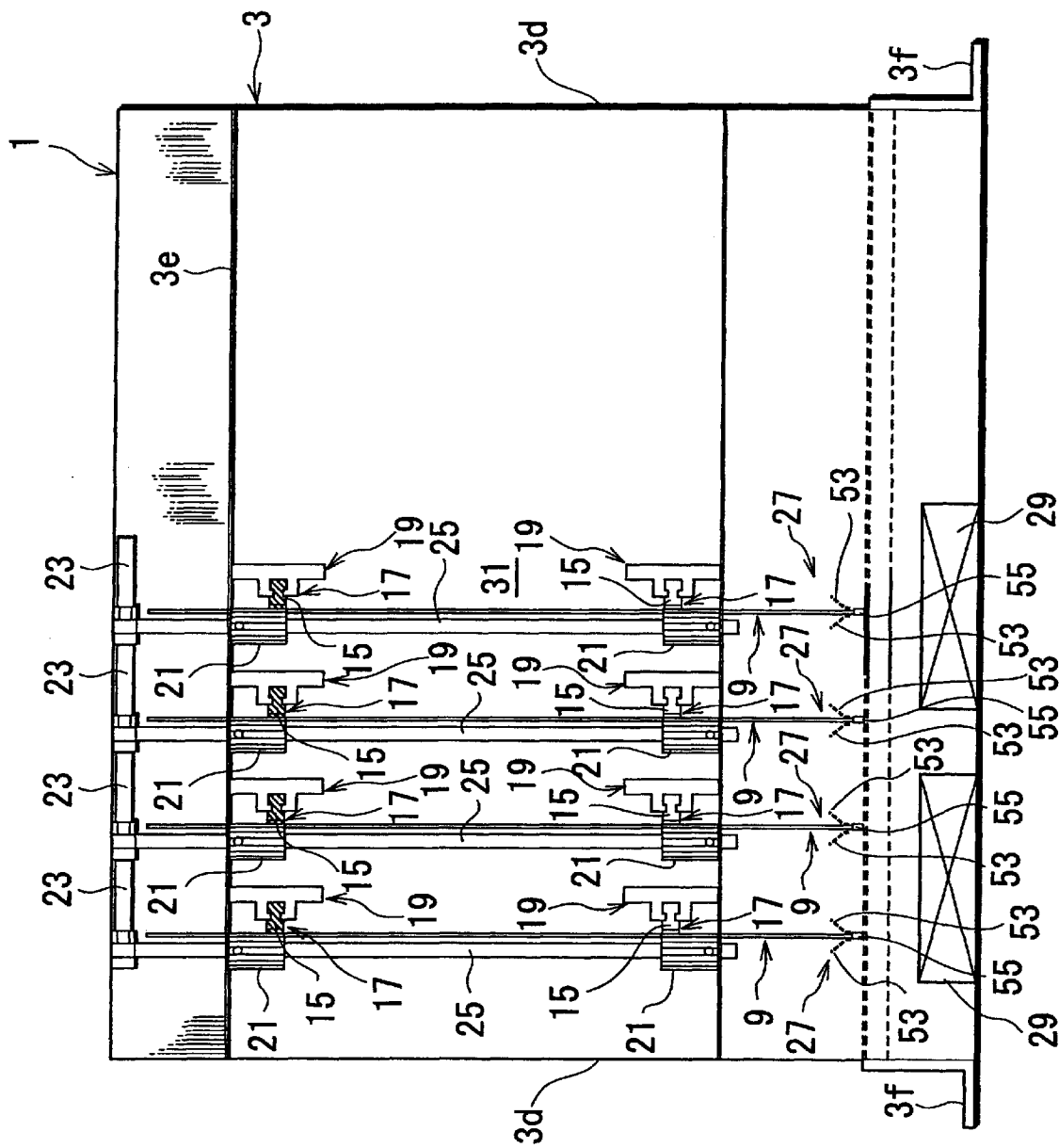
FIG. 7 is a plan view in the direction VII of FIG. 1, with part of the internal structure of the electronic equipment omitted.

FIG. 1 is an outer oblique view from the frontal direction of a piece electronic equipment according to an embodiment of the present invention, FIG. 2 is an outer oblique view of the electronic equipment viewed from the rear direction, FIG. 3 is an oblique view showing the main parts of an insertion/removal mechanism according to the embodiment, FIG. 4 is a front elevation in the direction IV of FIG. 1, FIG. 5 is a front elevation in the direction V of FIG. 1 FIG. 6 is a rear elevation in the direction VI of FIG. 2, and FIG. 7 is a plan view in the direction VII of FIG. 1, part of the internal structure of the electronic equipment being omitted in FIG. 4 to FIG. 7.

As shown in FIG. 1 through FIG. 4, a piece of electronic equipment 1 according to the present invention has an enclosure 3, a backplane board 5 acting as a mother board, a connector 7 acting as a first connection part, a child board 9, a connector 11 acting as a second connection part formed as one with the lower edge of the child board 9, a guide 13, a rack gear block 17 having a rack gear 15, a rack gear block support member 19, a rotating shaft 25 having a pinion gear 21 and a lever 23, a positioning guide member 27, and a cooling fan 29.

As shown in FIG. 1 and FIG. 2, the enclosure 3 has a substantially box-like shape, having a top plate 3a, a bottom plate 3b, a front plate 3c, and two side plates 3d, and has a partitioned child board housing part 31 (shown in FIG. 4). On the rear surface of the enclosure 3, which is one of its sides, is provided an aperture 33 forming an opening to the child board housing part 31, a plurality of child boards 9 being inserted into the child board housing part 31 along a substantially horizontal direction via the aperture 33 in a upright condition. The child boards 9 within the child board housing part 31 are arranged in a row, each in an upright attitude. The front plate 3c has formed in it a plurality of ventilation holes 35, which establish communication with the child board housing part 31. As shown in FIG. 4, a planar base 3e is disposed under the top plate 3a, this base 3e being substantially parallel with the top plate 3a, both edges of the base 3e being supported in a fixed manner by the side plates 3d. As shown in FIG. 6 and FIG. 7, two L-shaped brackets 3f, which are linked and fixed to a rack (not shown in the drawing) when the electronic equipment 1 is mounted in the rack, are fixed at the front edges of the side plates 3d.

As show in FIG. 4, the backplane board 5 is disposed substantially parallel with the bottom part of the enclosure 3 and removably fixed to the enclosure 3. On the upper surface of the backplane 5, which faces the child board housing part 31, are fixed a plurality of connectors 7, each corresponding to a child board 9. The connection plate parts 11 of each of the child boards 9 are inserted into and mated with the corresponding connectors 7, thereby making electrical connections with female terminals (not shown in the drawing) of the connectors 7. When the connection plate parts 11 are mated with the connectors 7, and when the connection plate parts 11 are pulled out from the connectors 7, it is necessary to push or pull, respectively, with a relatively large force.

As shown in FIG. 5, a child board support member 37 is fixed to the child board 9 over substantially the entire region of the upper edge part of each child board 9, forming a part thereof by attachment using swaged rivets 39. As shown in FIG. 6, the upper edge of the child board support member 37 has a substantially T-shaped cross-sectional shape that protrudes outward substantially perpendicularly therefrom with respect to the child board 9.

As shown in FIG. 5 and FIG. 6, a plurality of guides 13 extending linearly from the aperture 33 of the child board housing part 31 toward the front plate 3c are disposed at the upper part of the child board housing part 31, this guides 13 arranged substantially parallel to one another with substantially a uniform distance therebetween. As shown in FIG. 6, a substantially T-shaped mating groove 41, into which the child board support member 37 can be slidably mated, is formed at the lower side of the guides 13. These guides 13 are disposed at prescribed locations in correspondence with each of the connectors 7. As shown by the double-dot-dashed line in FIG. 5, the child board 9, by being inserted so that the child board support member 37 mates in the mating groove 41 (shown in FIG. 6), is inserted in a substantially vertically upright attitude into the child board housing part 31 via the aperture 33.

As shown in FIG. 3, a rack gear block 17 is fixed to the upper surface of each guide 13, extending upward along a direction substantially perpendicular to the upper surface thereof. The rack gear block 17 has a rack gear 15 formed on a surface of the guide 13 substantially parallel to the direction of extension of the guide 13, along a direction substantially perpendicular there to, and a slide mating member 43 having a substantially T-shaped cross-section, this slide mating member 43 extending from the rear surface of the rack gear 15.

A substantially T-shaped slide mating groove 45 with which the slide mating member 43 slidably mates is formed substantially perpendicularly to the rack gear block support member 19 fixed to the base 3e. By the slide mating member 43 sliding inside the slide mating groove 45, the guide 13 and the child board 9 supported thereby move up and down in substantially a perpendicular direction. The guide 13 moves between an upper position in which it comes into contact with the base 3e and a lower position, in which, as described below, an insertion plate 11 (shown in FIG. 5) of the child board 9 is completed mated into the connector 7 (shown in FIG. 5). With the guide 13 at the upper position, the child board support member 37 is inserted into or removed from the mating groove 41.

A rotating shaft 25 is disposed at the top of each guide 13 substantially parallel to the guide 13, this being substantially parallel to the insertion direction of the child board 9. As shown in FIG. 5, the rotating shaft 25 is rotationally supported by the support bracket 47 on the upper surface of the base 3e at two locations, at the front plate 3c and at the aperture 33 side of the enclosure 3.

As shown in FIG. 3, a pinion gear 21 meshed with the rack gear 15 is fixed to the rotating shaft 25 by a setscrew (not shown in the drawing). If the rotating shaft 25 is rotationally operated so as to rotate in the forward direction (the direction of arrow 200 in the drawing), the pinion gear 21 also rotates forward, so that the rack gear 15 meshed with the pinion gear 21 moves upward, thereby moving the guide 13 upward. If, however, the rotating shaft 25 is rotationally operated so as to rotate in the opposite direction (the direction of arrow 201 in the drawing), the pinion gear also rotates in reverse, so that the rack gear 15 meshed with pinion gear 21 moves downward, thereby moving the guide 13 downward.

As shown in FIG. 5, two sets of rack gears 15 (rack gear blocks 17) and pinion gears 21 are provided along the rotating shaft 25, that is, one set each at the front plate 3c side and the aperture 33 side.

As shown in FIG. 5, a lever is fixed to the end part of the rotating shaft 25 protruding to the outside from the aperture 33. As shown in FIG. 6, the lever 23 extends from the rotating shaft 25 and faces downward when the guide 13 is at the lower position (the position shown by the solid lines in the drawing).

The ratio of the length of the lever 23 and the gear diameter is set so that operation of the lever 23 is not forced when performing insertion and removal with respect to the connector 7 of the connection plate part 11. This is set in accordance with the contact pressure of mating with the connector 7 of the connection plate part 11, so that a relatively weak force used to rotationally operate the lever 23 can insert and remove the connection plate part 11.

As shown in FIG. 7, one positioning guide 27 is disposed in the child board housing part 31 for each child board 9. Each positioning guide 27 is formed by a two resilient metal pieces 53, which have mutually superposed proximal ends and distal ends which mutually move away from each other, and a metal piece proximal end link member 55, which links proximal ends of the resilient metal pieces 53.

As shown in FIG. 5, the inserted forward edge part 9a of a child board 9 that is inserted in the vertical attitude into the child board housing part 31 along the guide 13 provided at the upper position is inserted between the resilient metal pieces 53. When the connection plate part 11 is positioned vertically above the corresponding connector 7, that is, when the child board 9 reaches the temporary attachment position, the forward edge part 9a makes contact with the proximal end link member 55 so that the child board 9 is positioned at the temporary attachment position. When the child board 9 moves downward substantially vertically by the pinion gear 21 rotating in the reverse direction, the forward edge part 9a moves by sliding between the resilient metal plates 53. That is, the positioning guide 27 prevents wavering of the inserted forward edge part 9a when the child board 9 is moved upward and downward, and also guides the child board 9 to the fully attached position, in which the connection plate part 11 is fully mated with the connector 7. The positioning guide member 27 is electrically grounds the child board 9.

Additionally, as shown in FIG. 5 and FIG. 7, a cooling fan 29 is fixed relative to the enclosure 3 at the rear of the front plate 3c. The fan 29 causes cooling air to flow within the child board housing part 31 toward the aperture 33 in a direction parallel to the insertion direction of the child board 9.

When installing a child board 9, the guide 13 is set at the upper position, and with the child board support member 37 remaining inserted into the mating groove 41, the child board 9 is inserted into the child board housing part 31 from the aperture 33 in a substantially vertical attitude. When the child board 9 reaches the temporary attachment position, the inserted forward edge part 9a comes into contact with the proximal end link member 55, thereby positioning the child board at the temporary attachment position.

Once the child board 9 reaches the temporary attachment position, the lever 23 is operated so as to cause the rotating shaft 25 to rotate in the reverse direction. When the rotating shaft 25 rotates in the reverse direction, the pinion gear rotates in concert therewith, and the rack gear 15 (rack gear block 17) meshed with the pinion gear 21 moves downward, so that the guide 13 moves to the lower position. The effect of this is that the child board 9 at the temporary attachment position moves along a substantially vertical direction and reaches the permanent attachment position, the connection plate part 11 mating into the connector 7, so that the two elements are mutually connected. In this condition, the guide 13 holds the child board support member 37 so as to maintain the child board at the fully attached position.

When removing a child board 9, the lever 23 is operated to rotate it in the forward direction, thereby causing the rotating shaft 25 to rotate in the forward direction. When the rotating shaft 25 rotates in the forward direction, the pinion gear 21 rotates in concert therewith, and the rack gear 15 (rack gear block 17) meshed with the pinion gear 21 moves upward, so that the guide 13 moves to the upper position. The effect of this is that the connection plate part 11 is removed from the connector 7, so that the child board 9 at the fully attached position reaches the temporary attachment position by movement along a substantially vertical direction.

Once the child board has reached the temporary attachment position, the child board 9 is pulled along the guide 13, and exposed via the aperture 33 and, if necessary, the child board support member 37 is completely removed from the guide 13.

Thus, the insertion into and removal from the backplane board 5 of a child board in the child board housing part 31 is performed by movement in a substantially vertical direction, and the insertion and removal of the child board 9 with respect to the child board housing part 31 is performed by motion in a substantially horizontal direction.

The result of the above is that, because the child board is inserted and removed from the aperture 33 of the enclosure, even if the electronic equipment remains installed within a rack or the like, it is possible to easily remove the child board 9 for maintenance, without interference from other equipment disposed above or below the electronic equipment 1.

Because the backplane board 5 is disposed at the bottom part of the enclosure 3 and the child boards 9 are arranged in a row in a substantially upright attitude within the child board housing part 31, by the fan 29 causing cooling air to flow without being blocked by either the backplane board 5 or the child board 9.

Because it is possible to insert and remove a child board 9 with the electronic equipment 1 remaining installed in the rack, the need for a rack mounting rail to enable the equipment to be pulled out of the rack is eliminated, as is an increase in the size of the structure, and the need to provide a safety measure to prevent the rack from falling over.

Because the rotating shaft 25 is disposed substantially parallel to the insertion direction of the child board 9 above the guide 13, and one set of the rack gear 15 and the pinion gear 21 are provided separated along the rotating shaft 25, there is an further improvement in the upward and downward movement of the child board 9 according to the rack gear 15 and the pinion gear 21.

By providing a positioning guide member 27, the position of a child board 9 at the temporary attachment position is reliably established, and there is a further improvement in the stability of movement of the child board 9 from the temporary attachment position to the permanent attachment position.

The lever 23 can be used to easily rotate the rotating shaft 25.

Because the ratio between the length of the lever 23 and the gear diameter of the pinion gear 21 can be established in accordance with the contact pressure when the connection plate part 11 is mated with the connector 7, it is possible to avoid the application of excessive force when the connection plate part 11 is mated with or removed from the connector 7.

I will be understood that the present invention is not restricted to the embodiment described above, and can subjected to various design changes and the like within the technical scope of the present invention.

As described in detail above, according to the present invention it is not only possible to insert and remove a child board without interference from equipment disposed above or below the electronic equipment of interest, but also possible to cause a good flow of cooling air, without blockage by the mother board or a child board. Thus, it is possible to achieve both easy insertion and removal of the child board for maintenance and the like and good cooling air flow.

What is claimed is:

1. An electronic equipment, comprising:
   an enclosure defining a child board housing part provided with an aperture on a side thereof;
   a mother board fixed to a bottom part of the enclosure;
   a first connection part fixed to the mother board and facing the child board housing part;

a child board, which is inserted via the aperture in a substantially vertical attitude along a substantially horizontal direction to a temporary attachment position within the child board housing part;

a second connection part provided at a lower edge of the child board, the second connection part mating and connecting with the first connection part by the movement of the child board at the temporary attachment position along a substantially vertical direction so as to reach a fully attached position;

a guide provided so as to be freely movable along a substantially vertical direction between an upper position and a lower position within the child board housing part, the guide slidably mating with an upper edge part of the child board at the upper position and guiding the child board along a substantially horizontal direction to the temporary attachment position, movement from the upper position to event handler lower position causing the child board at the temporary attachment position to move along a substantially vertical direction to a fully attached position, and holding the upper edge part of the child board at the fully attached position;

a rack gear fixed relative to the guide; and a rotating shaft having a pinion gear meshed with the rack gear, which is supported so as to be rotatable relative to the enclosure, and which by rotating in a prescribed direction causes the guide, via the pinion gear and the rack, to move from the lower position to the upper position, and which by rotating in a direction opposite the prescribed direction causes the guide to move from the upper position to the lower position.

2. The electronic equipment according to claim 1, further comprising rack gear block extending from an upper surface of the guide along a substantially vertical direction; and a rack gear block support member fixed relative to the enclosure, the rack gear block support member supporting the rack gear block so as to enable the rack gear block to freely move by sliding along a substantially vertical direction, wherein
the rack gear is disposed along a substantially vertical direction on a side surface of the rack gear block.

3. The electronic equipment according to claim 1, wherein the rotating shaft disposed above the guide and substantially parallel to a direction of insertion of a child board, and wherein a plurality of sets of rack gears and pinion gears are provided along the rotating shaft.

4. The electronic equipment according to claim 1, wherein the mother board is disposed substantially horizontally, and wherein
the first connection part is disposed on an upper surface of the mother board.

5. The electronic equipment according to claim 1, further comprising:

a positioning guide member fixed inside the child board housing part relative to the enclosure within, the positioning guide member performing positioning of the child board at the temporary attachment position by coming into contact with the inserted forward edge of the child board, and mating in a sliding manner with the inserted forward edge so as to guide the child board from the temporary attachment position to the fully attached position.

6. The electronic equipment according to claim 5, wherein the positioning guide member electrically grounds the child board.

7. The electronic equipment according to claim 1, further comprising a rotationally operated lever extending from the rotating shaft.

8. The electronic equipment according to claim 7, wherein the ratio between a length of the lever and a gear diameter of the pinion gear is set in accordance with a contacting force when the first and the second connection parts mate together.

9. The electronic equipment according to claim 1, further comprising a fan, which causes cooling air to flow inside the board housing part in the direction of insertion of the child board.

10. A board insertion and removal apparatus for insertion and removal of a child board with respect to an electronic equipment, the electronic equipment having an enclosure with a portioned child board housing part, a mother board fixed to a bottom part of the enclosure, a first connection part fixed to the mother board and facing the child board housing part, a child board, which is inserted into the child board housing part, a second connection part provided at a lower edge of the child board, the second connection part mating and connecting with the first connection part, and an aperture being provided on a side of the enclosure so as to open the child board housing part, the board insertion and removal apparatus comprising:

a guide provided so as to enable free movement between an upper position and a lower position within the child board housing part along a substantially vertical direction, whereby at the upper position the guide slidably mates with an upper edge part of the child board so as to guide the child board from the aperture toward a temporary attachment position within the child board housing part along a substantially horizontal direction, movement from the upper position to the lower position causing the child board at the temporary attachment position to move toward a permanent attachment position in a substantially vertical direction, causing mating of the second connection part and the first connection part, and holding the upper edge part of the child board at the fully attached position;

a rack fixed relative to the guide; and a rotating shaft having a pinion gear meshing with the rack gear and being rotatably supported relative to the enclosure, rotational operation of the rotating shaft in a prescribed direction causing movement, via the pinion gear and the rack gear, of the guide from the lower position to the upper position, and rotational operation of the rotating shaft in a direction opposite to the prescribed direction causing movement of the guide from the upper position to the lower position.

* * * * *